(12) United States Patent
Hoinkis et al.

(10) Patent No.: US 7,786,007 B2
(45) Date of Patent: Aug. 31, 2010

(54) METHOD AND APPARATUS OF STRESS RELIEF IN SEMICONDUCTOR STRUCTURES

(75) Inventors: Mark Hoinkis, Fishkill, NY (US); Matthias Hierlemann, Munich (DE); Gerald Friese, Munich (DE); Andy Cowley, Wappingers Falls, NY (US); Dennis J. Warner, Mechanicsville, VA (US); Erdem Kaltalioglu, Wappingers Falls, NY (US)

(73) Assignee: Infineon Technologies AG, Munich (DE)

( * ) Notice: Subject to any disclaimer, the term of this patent is extended or adjusted under 35 U.S.C. 154(b) by 213 days.

(21) Appl. No.: 12/098,976

(22) Filed: Apr. 7, 2008

(65) Prior Publication Data

US 2008/0213993 A1 Sep. 4, 2008

Related U.S. Application Data

(62) Division of application No. 10/439,874, filed on May 16, 2003, now Pat. No. 7,368,804.

(51) Int. Cl.
*H01L 21/4763* (2006.01)
(52) U.S. Cl. ............... 438/637; 438/669; 257/E21.589
(58) Field of Classification Search ......... 438/631–637, 438/669–672; 257/E21.589, E21.576, E23.45
See application file for complete search history.

(56) References Cited

U.S. PATENT DOCUMENTS

| | | | |
|---|---|---|---|
| 5,523,163 A | 6/1996 | Ballance et al. | |
| 5,906,859 A | 5/1999 | Bremmer et al. | |
| 6,046,503 A * | 4/2000 | Weigand et al. | 257/758 |
| 6,210,749 B1 | 4/2001 | Bremmer et al. | |
| 6,486,059 B2 | 11/2002 | Lee et al. | |
| 6,638,849 B2 | 10/2003 | Ting et al. | |
| 6,972,209 B2 | 12/2005 | Agarwala et al. | |
| 7,368,804 B2 | 5/2008 | Hoinkis et al. | |
| 2003/0042580 A1 | 3/2003 | Hoinkis et al. | |
| 2003/0214041 A1 | 11/2003 | Suzuki et al. | |
| 2004/0087135 A1 | 5/2004 | Canaperi et al. | |
| 2005/0221610 A1 | 10/2005 | Hoinkis et al. | |
| 2006/0014376 A1* | 1/2006 | Agarwala et al. | 438/622 |
| 2007/0018330 A1 | 1/2007 | Takeda et al. | |

* cited by examiner

*Primary Examiner*—Thomas L Dickey
*Assistant Examiner*—Fazli Erdem
(74) *Attorney, Agent, or Firm*—Slater & Matsil, L.L.P.

(57) ABSTRACT

A method, apparatus and system are provided for relieving stress in the via structures of semiconductor structures whenever a linewidth below a via is larger than a ground-rule, including providing a via at least as large as the groundrule, providing a landing pad above the via, providing a via bar in place of a via, slotting the metal linewidth below the via, or providing an oversize via with a sidewall spacer.

18 Claims, 9 Drawing Sheets

METHOD AND APPARATUS OF STRESS RELIEF IN SEMICONDUCTOR STRUCTURES

This application is a divisional of application Ser. No, 10/439,874, filed May 16, 2003, now U.S. Pat. No. 7,368,804 and entitled "Method and Apparatus of Stress Relief in Semiconductor Structures", which application is incorporated herein by reference.

TECHNICAL FIELD

The present invention relates to the relief of stress in semiconductor structures, and more particularly relates to the relief of stress in the via structures of SiLK™ semiconductor structures.

BACKGROUND

SiLK™ is a trademark of Dow Chemical for a polymer thermoset resin exhibiting very low dielectric constant, useful in semiconductor manufacturing, and described in Balance et al., U.S. Pat. No. 5,523,163, for LOW DIELECTRIC CONSTANT COATINGS, issued Jun. 4, 1996, and Bremmer et al. U.S. Pat. No. 5,906,859, for a METHOD FOR PRODUCING LOW DIELECTRIC COATINGS FROM HYDROGEN SILSEQUIOXANE RESIN, issued May 25, 1999, and Bremmer et al., U.S. Pat. No. 6,210,749, THERMALLY STABLE DIELECTRIC COATINGS, issued Apr. 3, 2001, the disclosures of all of which are incorporated by reference herein in their entirety. SiLK™ structures are increasingly being used to replace silicon oxide ($S_iO_2$) as a dielectric because of its superior dielectric qualities, namely a dielectric constant of 2.65 compared with 4.1 for silicon oxide.

SiLK™ also demonstrates comparable toughness and greater resilience than the more brittle silicon oxide. Low dielectric constant in a material permits smaller structures to be manufactured, which in turn permits closer packing of devices, faster speeds, and reduced crosstalk. The spin-on aromatic polymer has no fluorine in its composition, delivers superior planarization and gapfill, and is stable to 490° C. These properties have made SiLK™ popular for a variety of CMOS technologies demanding "low-K" interlayer dielectrics, such as copper/damascene and aluminum/tungsten technologies.

There are stress problems, however, in vias built with SiLK™ that do not occur with traditional silicon oxide vias. These stresses result in thermal cycle and in-line via-resistance shifts. There are at least three cases in which two-dimensional modeling has predicted high stresses in SiLK™ vias wherein thermal-cycle reliability failures have been directly correlated with the stress, namely (1) vias built in SiLK™ rather than silicon oxide, (2) vias built in SiLK™ wherein the subsequent level is executed in silicon oxide instead of SiLK™ and (3) vias built in SiLK™ wherein the next level is built in oxide compared with vias built in SiLK™ with a stress-relief layer prior to the subsequent level being built in oxide.

A stress problem with SiLK™ is illustrated in FIG. 1a, showing a pair of semiconductor cross-sections depicting a typical prior art oxide embodiment A and a prior art SiLK™ embodiment B of a wafer structure, each comprising a base layer 1 of silicon substrate, atop of which is a silicon oxide base layer 2. Upon these are a first conductive line 3 and a second conductive line 4, usually made of copper metal, that join one another through a first via 5, which penetrates a level-separating nitride layer 6 that separates the first level 10 from a second level 20. In both drawings, third 30 and fourth 40 levels are shown, also separated by level-separating nitride layers 6, the third level 30 comprising a silicon oxide layer 8 and the fourth level 40 comprising a silicon oxide layer 9 beneath a silicon nitride cap 11. Cross-section A shows a typical via 5 defined by a first level silicon oxide layer 7 and partly by the base silicon oxide layer 2. Cross-section B, however, shows a via 5 defined by a second level SiLK™ layer 7' and a base level SiLK™ structure 2'. The differences between the two structures may be seen in corresponding stress analysis images A', B', wherein darkened areas indicate high stresses. Comparing B' to A', it is apparent that the SiLK™ via structure creates much more stress and distortion than the traditional silicon oxide structure.

Referring to FIG. 1b, plots 100 of via resistance shift in Ohms/link are shown for SiLK™ and for oxide, respectively. What is needed is a method suitable for making SiLK™ via structures with reduced stress.

SUMMARY OF THE INVENTION

A method, apparatus and system are provided for relieving stress in the via structures of semiconductor structures whenever a linewidth below a via is larger than a ground-rule, including providing a via at least as large as the groundrule, providing a landing pad above the via, providing a via bar in place of a via, slotting the metal linewidth below the via, or providing an oversize via with a sidewall spacer.

BRIEF DESCRIPTION OF THE DRAWINGS

The present disclosure teaches a method, apparatus and system for relieving stress in the via structures of semiconductor structures whenever a linewidth below a via is larger than a ground-rule, in accordance with the following exemplary figures, in which.

DETAILED DESCRIPTION OF ILLUSTRATIVE EMBODIMENTS

Some of the "8SF" SiLK™-related reliability issues, including thermal cycle and in-line via-resistance shift problems in particular, have been related to stress in the via as determined by stress modeling. There are at least three cases in which 2D stress modeling has predicted high stress in the via and in which thermal-cycle reliability failures have been correlated with this higher stress: 1) vias built in SiLK™ compared with vias built in oxide (FIG. 1); 2) vias built in SiLK™ in which the subsequent level is built in oxide as compared with the subsequent level being built in SiLK™ (FIG. 2a); and 3) vias built in SiLK™ in which the next level is built in oxide compared with vias built in SiLK™ with a stress-relief layer prior to the subsequent level being built in oxide (FIG. 3).

Figure 1A:
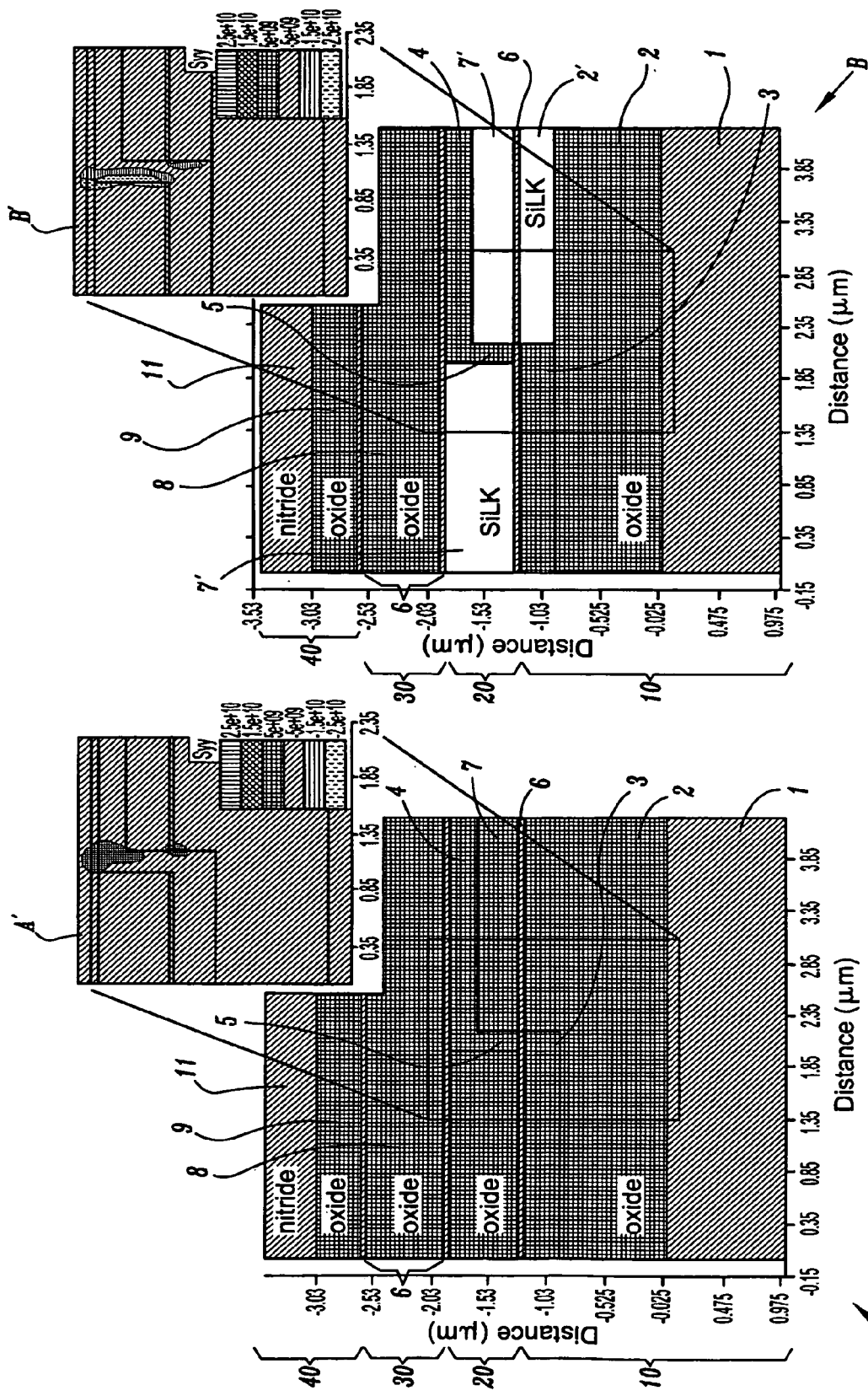
FIG. 1a shows a schematic diagram of typical vias built in SiLK™ compared with vias built in oxide.
Figure 1B:
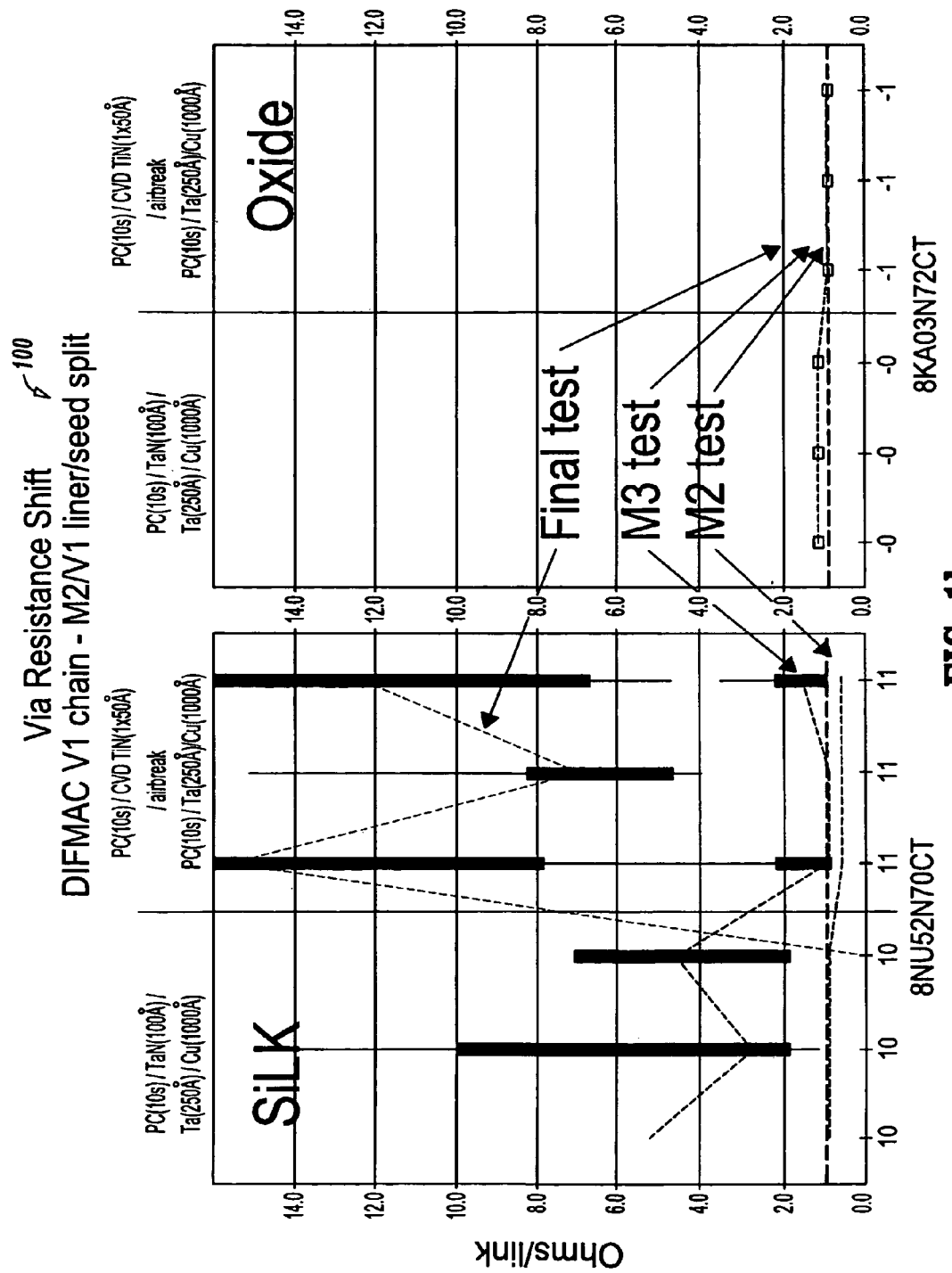
FIG. 1b shows a graphical diagram for via resistance of typical vias built in SiLK™ compared with vias built in oxide.
Figure 2A:
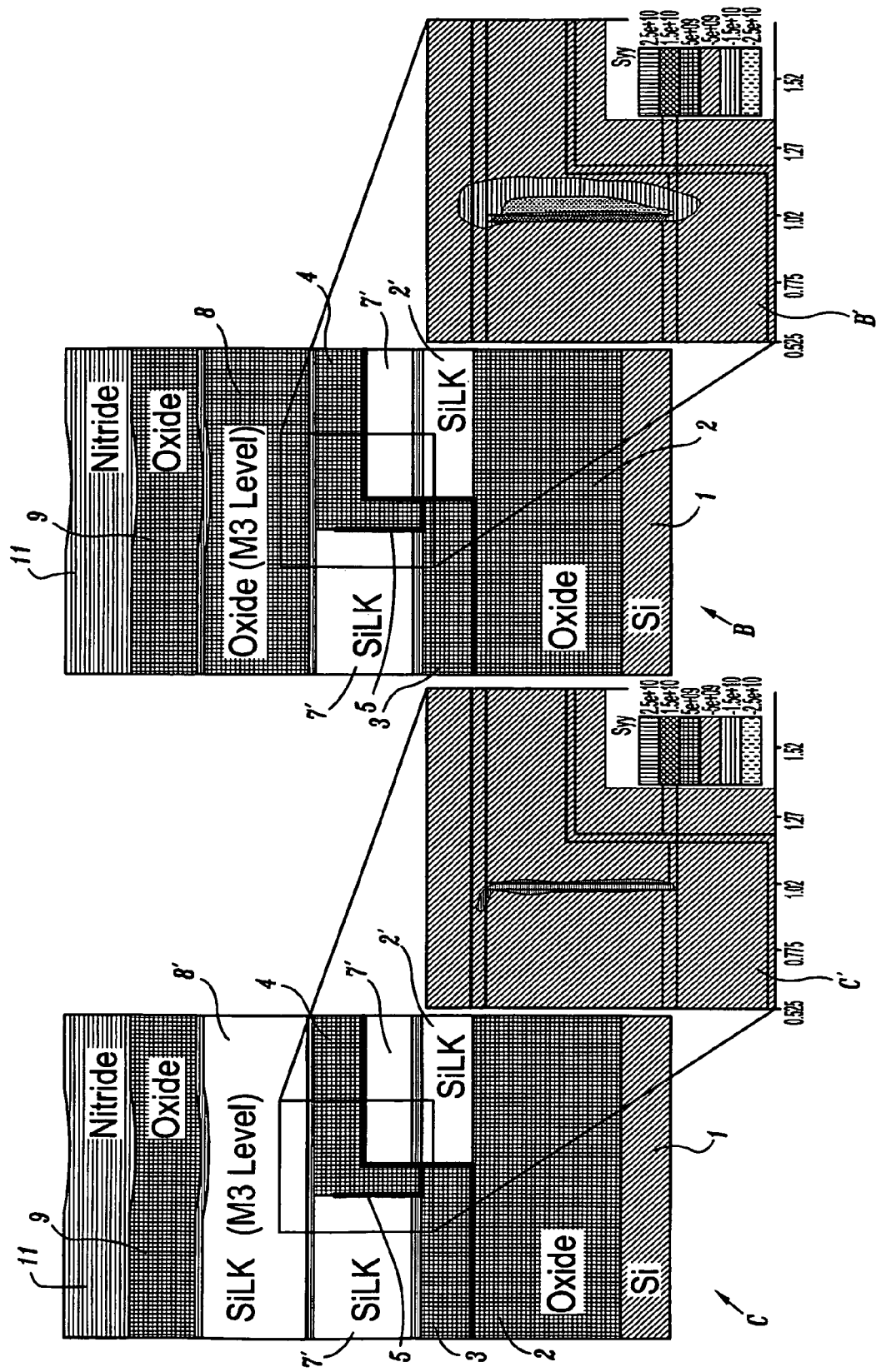
FIG. 2a shows a partial schematic diagram of vias built in SiLK™ in which the subsequent level is built in oxide as compared with the subsequent level being built in SiLK™ according to an embodiment of the present disclosure.

Referring to FIG. 2a, there is shown side-by-side a cross-section of a first embodiment of the invention C and the prior art SiLK™ embodiment B from FIG. 1. As can be seen, the structures are identical except that in the inventive embodiment C the third level silicon oxide layer 8 has been replaced with a SiLK™ "stress-relief" layer 8'. Examination of the stress analysis images C' and B' plainly show a reduction of stress in the C structure over the prior art.

Figure 2B:
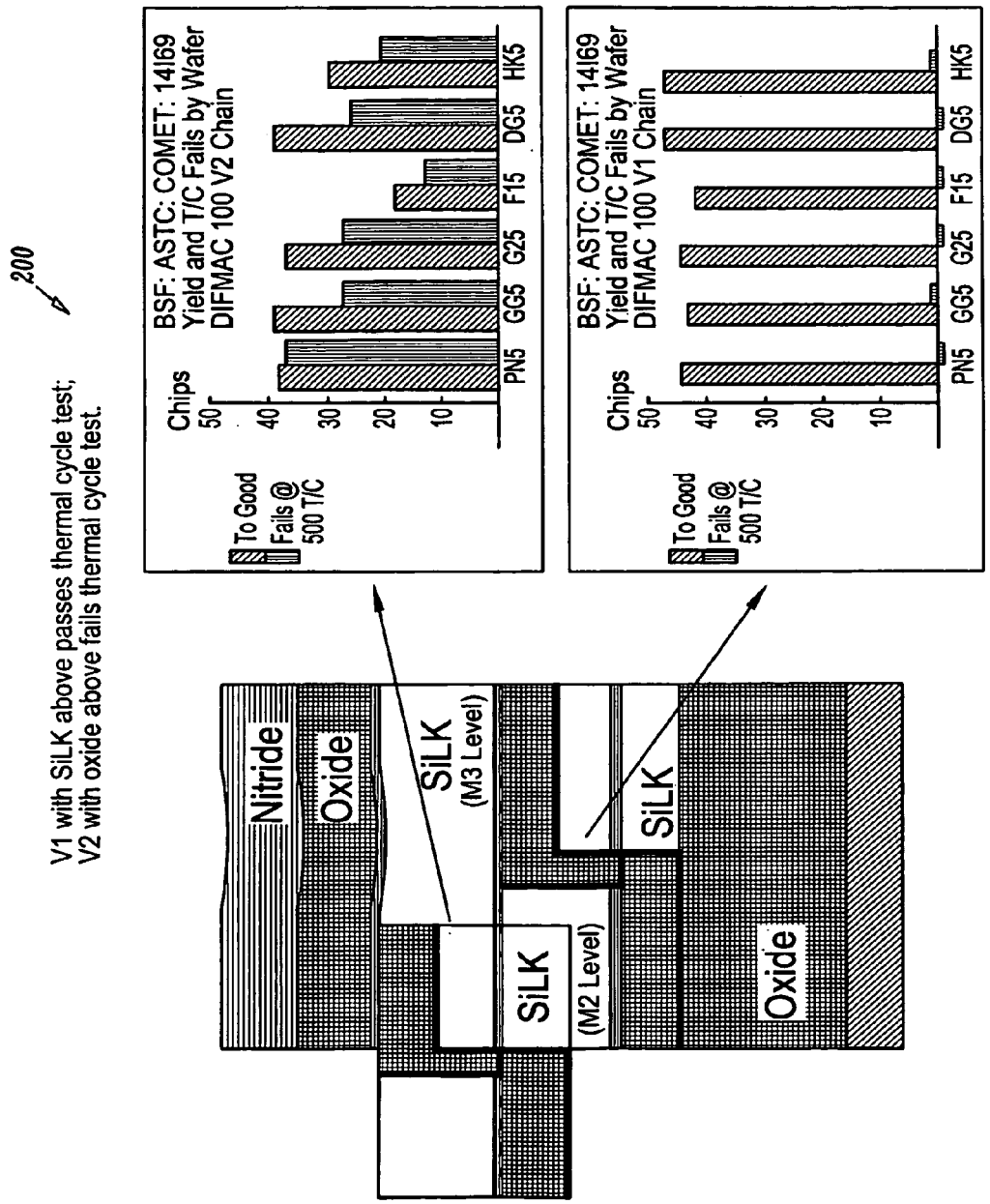
FIG. 2b shows a graphical diagram of vias built in SiLK™ in which the subsequent level is built in oxide as compared with the subsequent level being built in SiLK™ according to an embodiment of the present disclosure.

Referring to FIG. 2b, there are shown histograms 200 that quantitatively demonstrate the superiority of the inventive embodiment C over the prior art SiLK™ embodiment B. Here, the via V1 with SiLK™ above passed thermal cycle tests, while the via V2 with oxide above failed the same thermal cycle tests.

Figure 3:
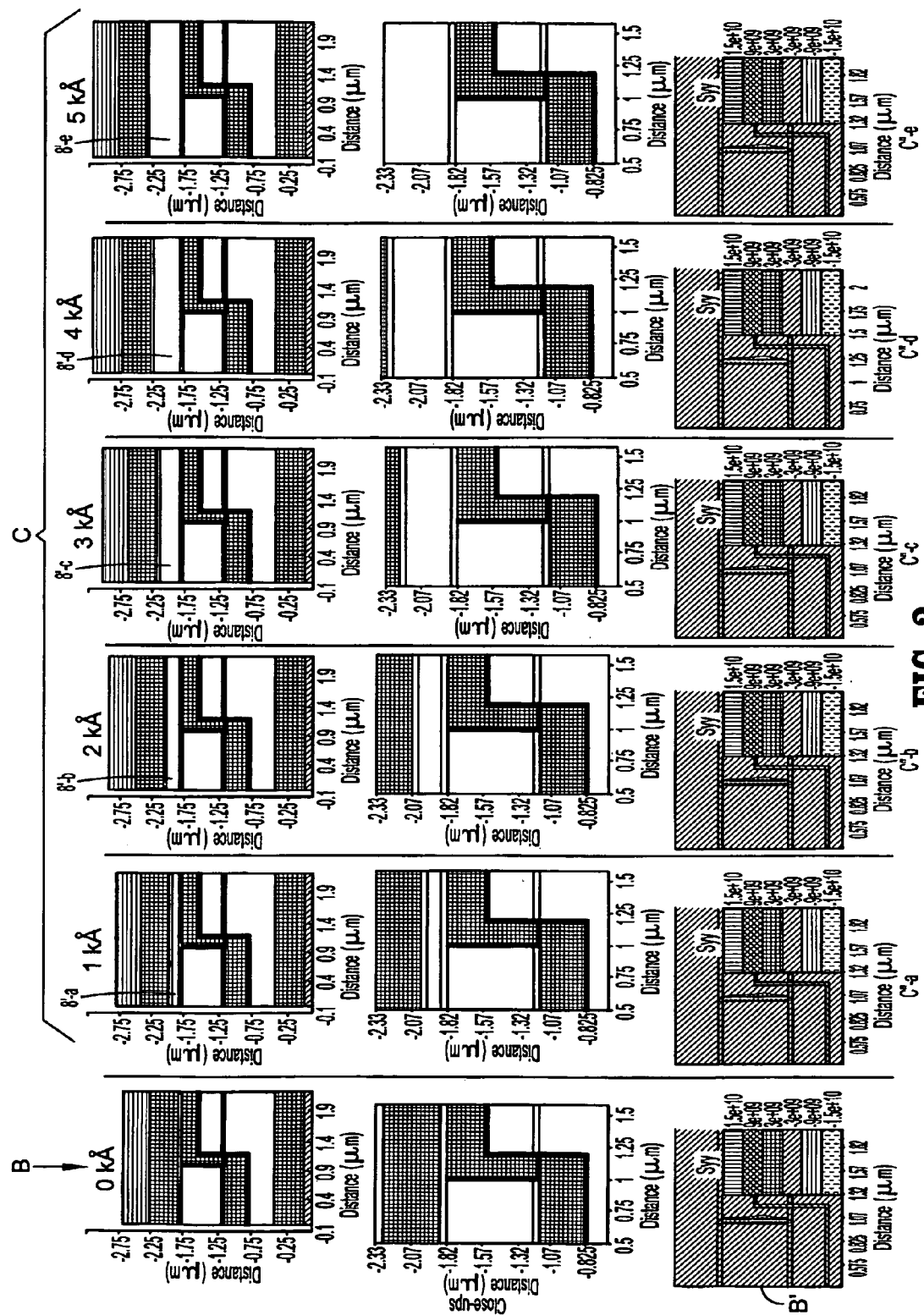
FIG. 3 shows a schematic diagram of vias built in SiLK™ in which the next level is built in oxide compared with vias built in SiLK™ with a stress-relief layer prior to the subsequent level being built in oxide according to an embodiment of the present disclosure.

Referring to FIG. 3, there is shown the prior art SiLK™ embodiment B next to five variants of the inventive embodiment C of the invention, wherein the stress-relieving SiLK™ layer 8' is varied in thickness from 1,000 to 5,000 Angstroms in increments of 1,000 Angstroms. As can be seen in the stress analysis images C'-a through C'-e, there is no appreciable gain in stress relief above one thousand Angstroms. Hence, a 1,000 Angstrom SiLK™ stress-relief layer is all that is required to obtain substantially all of the benefits of the invention.

Figure 4:
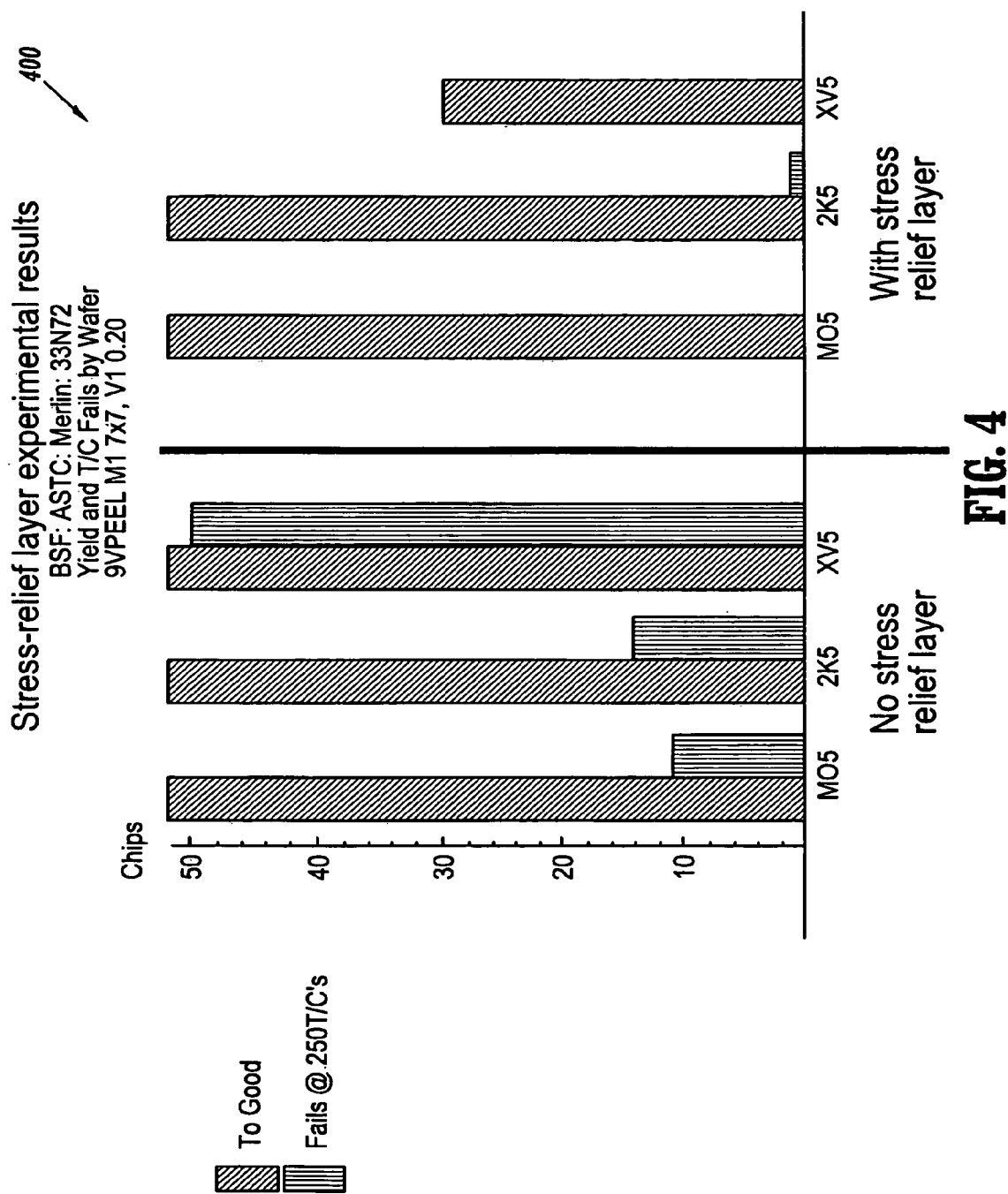
FIG. 4 shows a graphical diagram of stress-relief layer experimental results according to an embodiment of the present disclosure.
Figure 5:
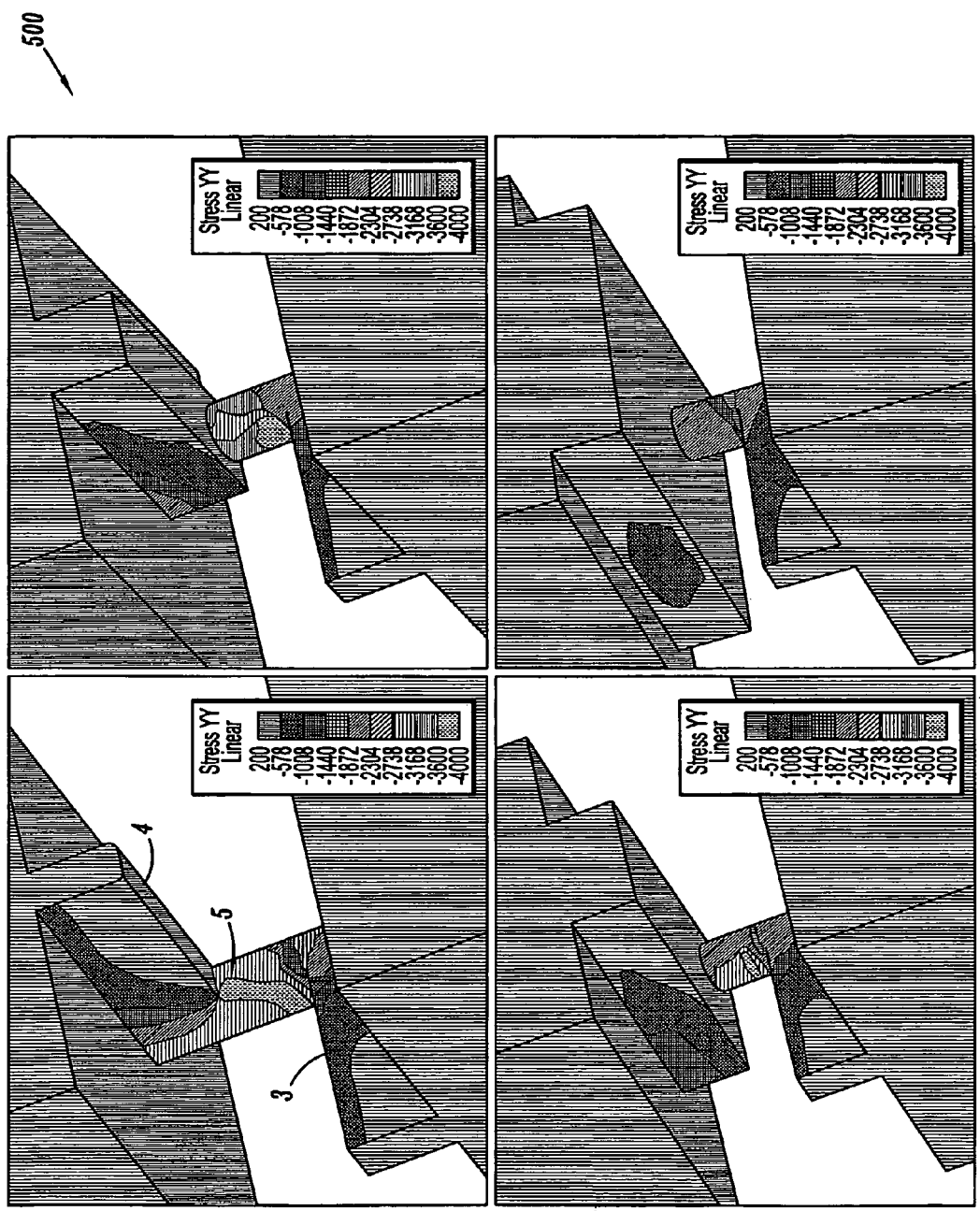
FIG. 5 shows a schematic diagram of vias where a second conductive line varies in width according to an embodiment of the present disclosure.
Figure 6:
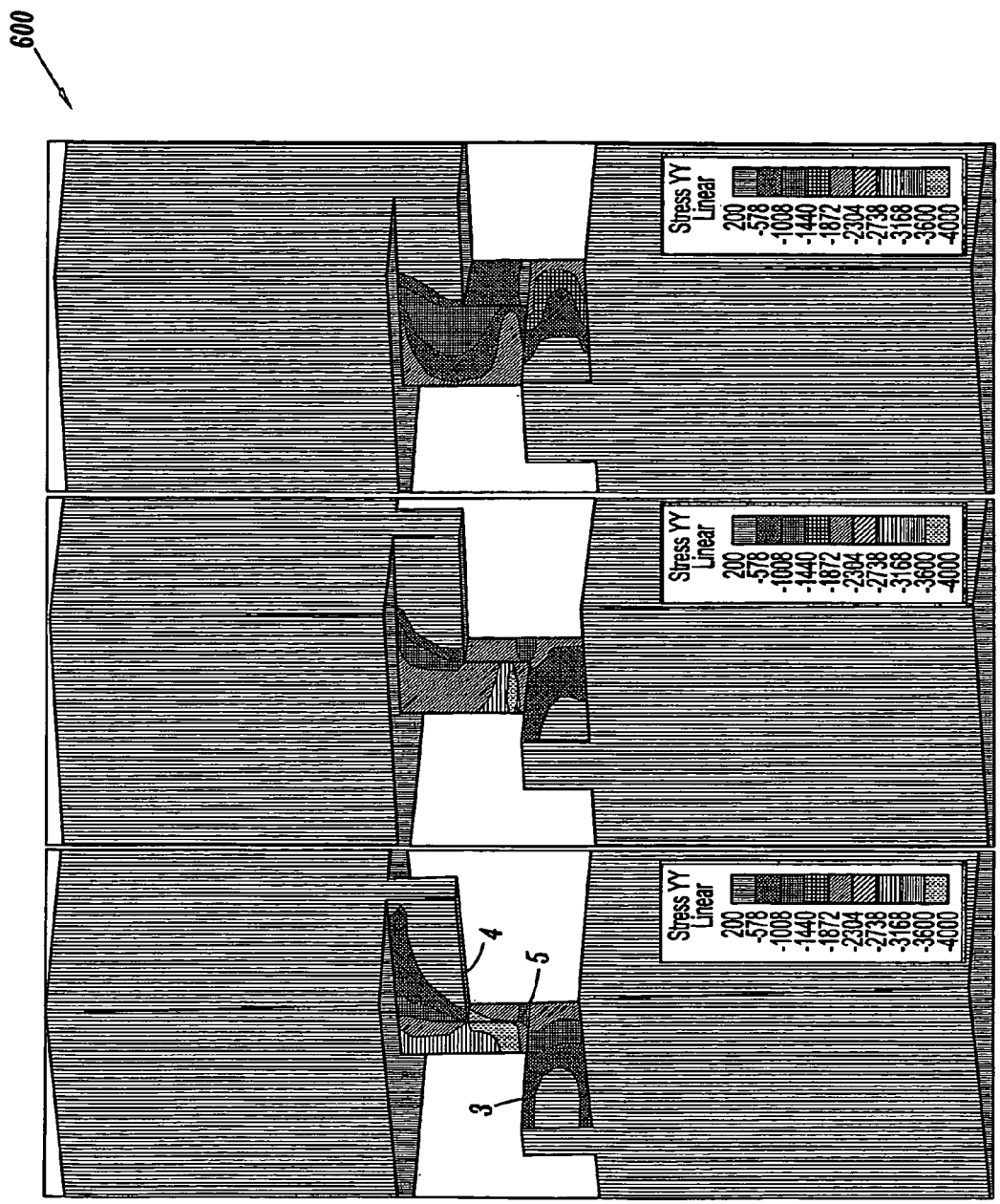
FIG. 6 shows a schematic diagram of vias where stress is substantially reduced by increasing via thickness according to an embodiment of the present disclosure.

More recently, 3D stress modeling has been performed and has shown several interesting geometry-dependent stress phenomena. The first is that as the metal linewidth above a via increases, the stress in the via decreases (FIG. 4). The second is that as the via-diameter increases, the stress in the via decreases (FIG. 5). And third, as the linewidth below the via increases, the stress in the via also increases (FIG. 6). These stress-modeling results suggest that a ground-rule line above a via with a large linewidth beneath the via has the highest possible stress in the via. Experimentally, we observe that our "plate-below" macro fails the easiest in terms of thermal-cycle reliability testing. As our modeling shows, by increasing the linewidth above a via, stress should be reduced. Experimentally we observe few or no failures with "plate-above" macros.

Referring to FIG. 4, charts 400 of stress-relief layer experimental results illustrate significantly higher failure rates for SiLK™ with no stress-relief layer versus significantly lower failure rates for SiLK™ with the a stress-relief layer according to an embodiment of the present disclosure.

Referring to FIG. 5, three dimensional images 500 show a via 5 joining a lower first 3 and upper second 4 conductive lines. The four images are identical except that the second conductive line varies in width. As can be seen, by increasing the width of the second upper conductive line, stress is substantially reduced.

Referring to FIG. 6, three dimensional images 600 show a via joining a lower first 3 and upper second 4 conductive lines. Here, it is the diameter of the via 5 that varies. This demonstrates that stress is substantially reduced by increasing via thickness.

Figure 7:
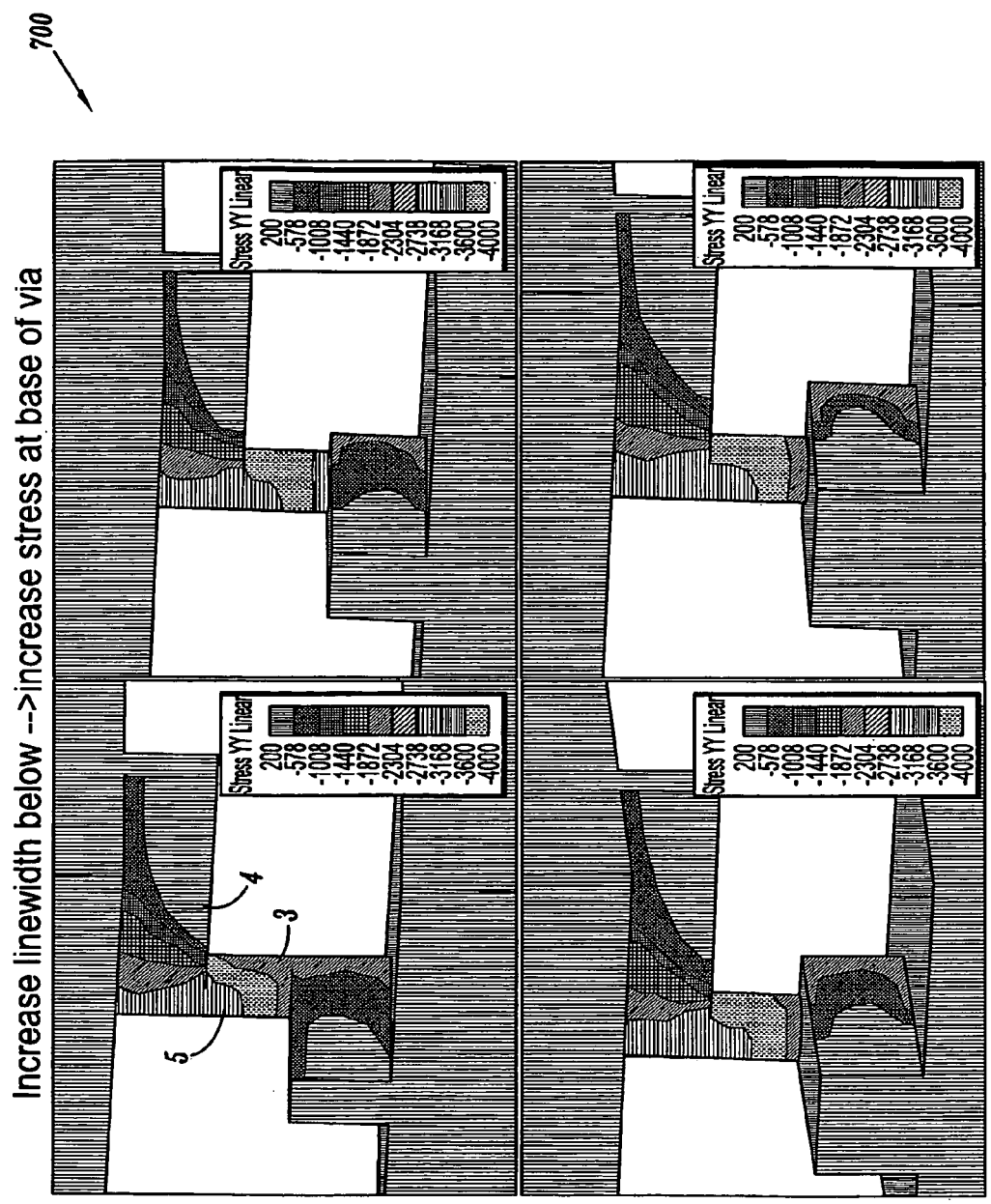
FIG. 7 shows a schematic diagram of vias where the width of the first lower conductive line varies according to an embodiment of the present disclosure.

Referring to FIG. 7, there is again shown a three dimensional image of a via joining a lower first 3 and upper second 4 conductive lines, but here it is the width of the first lower conductive line 3 that varies. Note that here, an increase in the lower conductive line 3, which is adjacent to the silicon oxide substrate layer 2, results in an increase in stress, not a decrease as may have been expected.

The above results allow formulation of inventive design rules for the manufacture of SiLK™ vias. In doing so, we refer to the "groundrule" width of a via, conductive line, or other structure. By "groundrule", we mean the smallest size available given the current technology at the time of manufacture. Unfortunately, lower conductive lines are generally larger than groundrule and therefore contribute to SiLK™ stress. The inventive design rules are as follows:

Whenever a linewidth below a via is larger than groundrule:
1. require a via larger than groundrule;
2. require a landing pad above the via (ground-rule or larger);
3. use a via bar in place of a via;
4. slot the metal linewidth below the via;
5. use an oversize via with sidewall spacer.

Thus, embodiments of the present disclosure impose specific design-rules for copper metallization built in SiLK™ so that stress in the via is minimized. With such an approach, a reliable copper metallization with SiLK™ can be realized. Improvements in stress-relief will be realized by implementing any number of the above design rules.

It is to be understood that all physical quantities disclosed herein, unless explicitly indicated otherwise, are not to be construed as exactly equal to the quantity disclosed, but rather as about equal to the quantity disclosed. Further, the mere absence of a qualifier such as "about" or the like, is not to be construed as an explicit indication that any such disclosed physical quantity is an exact quantity, irrespective of whether such qualifiers are used with respect to any other physical quantities disclosed herein.

While preferred embodiments have been shown and described, various modifications and substitutions may be made thereto without departing from the spirit and scope of the invention. Accordingly, it is to be understood that the present invention has been described by way of illustration only, and such illustrations and embodiments as have been disclosed herein are not to be construed as limiting to the claims.

What is claimed is:

1. A method of reducing stress in via structures, the method comprising:
   forming a via in a polymer thermoset resin material above a first metal line, the via comprising a width larger than a ground rule width, wherein a line width of the first metal line is larger than a groundrule line width, wherein copper vias having a width smaller than the groundrule width are not formed within the polymer thermoset resin material; and
   forming a second metal line above the via in the polymer thermoset resin material, the via coupling the first metal line to the second metal line, the via, the first and the second metal lines comprising copper.

2. The method of claim 1, wherein forming the via above the first metal line comprises forming the via with a sidewall spacer.

3. The method of claim 1, wherein forming the via in a polymer thermoset resin material above the first metal line comprises:
   forming a first dielectric layer over a substrate;
   forming the first metal line in the first dielectric layer;
   forming the polymer thermoset resin material over the first dielectric layer and the first metal line; and
   forming a via through the polymer thermoset resin material.

4. The method of claim 1, further comprising forming a stress-relief layer over the second metal line.

5. The method of claim 4, wherein forming a stress-relief layer comprises forming a third dielectric layer comprising a polymer thermoset resin layer over a second dielectric layer and the second metal line, the second dielectric layer disposed adjacent to the via and disposed above the first metal line.

6. The method of claim 5, wherein the third dielectric layer comprises a thickness greater than about 1,000 Å.

7. The method of claim 5, wherein forming the third dielectric layer comprises forming a polymer thermoset resin layer over a nitride layer.

8. A method of forming a semiconductor die, the method comprising:
   forming a first dielectric layer over a substrate;
   forming first conductive lines in the first dielectric layer, the first conductive lines comprising a line width that is greater than a groundrule line width;
   forming a second dielectric layer over the first dielectric layer and the first conductive lines;
   forming second conductive lines in the second dielectric layer; and
   forming vias through the second dielectric layer, the vias electrically coupling the first conductive lines to the second conductive lines, wherein a width of the vias is greater than a groundrule width for the semiconductor die, wherein the vias comprise copper and wherein the second dielectric layer comprises a polymer thermoset resin layer, and wherein copper vias having a width smaller than the groundrule width are not formed within the polymer thermoset resin layer.

9. The method of claim 8, wherein the first dielectric layer comprises the polymer thermoset resin layer.

10. The method of claim 9, wherein the first dielectric layer comprises a dielectric constant of about 2.65.

11. The method of claim 8, wherein forming the first dielectric layer over the substrate comprises forming a polymer thermoset resin layer over an oxide layer, wherein the first conductive lines are formed in the polymer thermoset resin layer, and wherein the first conductive lines contact the oxide layer.

12. The method of claim 8, further comprising forming a third dielectric layer over the second dielectric layer and the second conductive layer, the third dielectric layer comprising a polymer thermoset resin layer.

13. The method of claim 12, wherein the third dielectric layer comprises a thickness greater than about 1,000 Å.

14. The method of claim 8, wherein forming a third dielectric layer over the second dielectric layer and the second conductive layer comprises forming a polymer thermoset resin layer over a nitride layer.

15. The method of claim 8, wherein forming first conductive lines in the first dielectric layer comprises forming copper lines in the first dielectric layer.

16. The method of claim 8, wherein a line width of the second conductive lines is greater than a groundrule width for the second conductive lines.

17. The method of claim 8, wherein forming vias through the second dielectric layer comprises forming vias with sidewall spacers.

18. A method of forming a semiconductor die, the method comprising:
   forming a first polymer thermoset resin layer on a first dielectric layer;
   forming first conductive lines in the first polymer thermoset resin layer, at least one of the first conductive lines having a line width that is greater than a groundrule width;
   forming a second polymer thermoset resin layer on the first polymer thermoset resin layer and the first conductive lines;
   forming second conductive lines in the second polymer thermoset resin layer;
   forming vias comprising copper through the second polymer thermoset resin layer, the vias electrically coupling the first conductive lines to the second conductive lines, wherein a width of the vias is greater than a groundrule width for the semiconductor die, wherein the second polymer thermoset resin layer does not comprise vias comprising copper with widths smaller than the groundrule width;
   forming a nitride layer on the second polymer thermoset resin layer and the second conductive lines; and
   forming a third polymer thermoset resin layer on the nitride layer, wherein the first, second, and third polymer thermoset resin layers comprise a dielectric constant lower than silicon oxide.

* * * * *